US012689174B2

(12) United States Patent
Koda et al.

(10) Patent No.: US 12,689,174 B2
(45) Date of Patent: Jul. 21, 2026

(54) SURFACE EMITTING LASER AND SURFACE EMITTING LASER ARRAY

(71) Applicant: SONY GROUP CORPORATION, Tokyo (JP)

(72) Inventors: Rintaro Koda, Tokyo (JP); Yasutaka Higa, Tokyo (JP); Go Hirano, Tokyo (JP); Shuhei Yamaguchi, Tokyo (JP); Tatsuya Matou, Tokyo (JP); Hideki Watanabe, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 595 days.

(21) Appl. No.: 18/249,550

(22) PCT Filed: Oct. 20, 2021

(86) PCT No.: PCT/JP2021/038688

§ 371 (c)(1),
(2) Date: Apr. 19, 2023

(87) PCT Pub. No.: WO2022/091890

PCT Pub. Date: May 5, 2022

(65) Prior Publication Data

US 2024/0022040 A1 Jan. 18, 2024

(30) Foreign Application Priority Data

Oct. 27, 2020 (JP) ................................. 2020-179990

(51) Int. Cl.
*H01S 5/02* (2006.01)
*H01S 5/183* (2006.01)
*H01S 5/42* (2006.01)

(52) U.S. Cl.
CPC ........ *H01S 5/0207* (2013.01); *H01S 5/18305* (2013.01); *H01S 5/423* (2013.01)

(58) Field of Classification Search
CPC .... H01S 5/0207; H01S 5/18305; H01S 5/423; H01S 5/18308; H01S 5/18358
See application file for complete search history.

(56) References Cited

U.S. PATENT DOCUMENTS 5,351,257 A      9/1994  Lebby
5,387,543 A  *   2/1995  Ackley ............... H01S 5/18327
                                          148/DIG. 95
(Continued)

FOREIGN PATENT DOCUMENTS

JP          04-216691 A      8/1992
JP          06-097564 A      4/1994
(Continued)

OTHER PUBLICATIONS

International Search Report and Written Opinion of PCT Application No. PCT/JP2021/038688, issued on Jan. 11, 2022, 10 pages of ISRWO.

*Primary Examiner* — Yuanda Zhang
(74) *Attorney, Agent, or Firm* — CHIP LAW GROUP

(57) ABSTRACT

A surface emitting laser according to one embodiment of the present disclosure includes: a substrate having a convex part provided on a surface thereof; and a vertical resonator structure formed on the substrate, and including an active layer, a first semiconductor layer, and a current blocking layer. The first semiconductor layer is a semiconductor layer of a first conductivity type having a step structure part having a shape conforming to the convex part at a location facing the convex part. The current blocking layer is a semiconductor layer of a second conductivity type different from the first conductivity type and having an opening in which an inner peripheral surface is in contact with an outer peripheral surface of the step structure part.

7 Claims, 11 Drawing Sheets

(56) References Cited

U.S. PATENT DOCUMENTS

| | | | |
|---|---|---|---|
| 5,446,752 A | 8/1995 | Ackley et al. | |
| 5,977,604 A | 11/1999 | Babic et al. | |
| 6,542,527 B1 | 4/2003 | Gopinath | |
| 2002/0079497 A1 | 6/2002 | Gopinath | |
| 2007/0013996 A1 | 1/2007 | Verma | |
| 2008/0056321 A1* | 3/2008 | Motomura | H01S 5/18308 |
| | | | 372/45.01 |
| 2011/0101419 A1* | 5/2011 | Hata | H01L 21/0254 |
| | | | 257/190 |
| 2018/0090909 A1 | 3/2018 | Graham | |
| 2019/0288483 A1* | 9/2019 | Sugiyama | H01S 5/04256 |

FOREIGN PATENT DOCUMENTS

| | | | |
|---|---|---|---|
| JP | 06-268330 A | 9/1994 | |
| JP | 07-263796 A | 10/1995 | |
| JP | 08-236865 A | 9/1996 | |
| JP | 2001-210908 A | 8/2001 | |
| JP | 2004-335964 A | 11/2004 | |
| JP | 2019-530246 A | 10/2019 | |
| JP | 2020-021879 A | 2/2020 | |
| JP | 2020-021883 A | 2/2020 | |
| WO | 2005/074080 A1 | 8/2005 | |
| WO | 2017/047317 A1 | 3/2017 | |

* cited by examiner

[ FIG. 1 ]
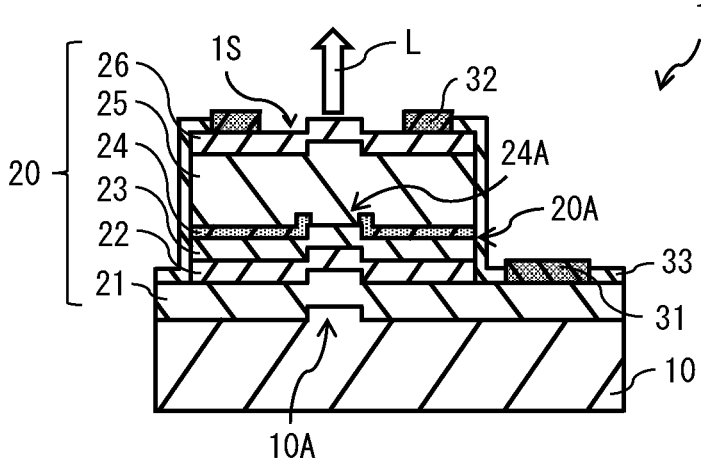
[ FIG. 2 ]
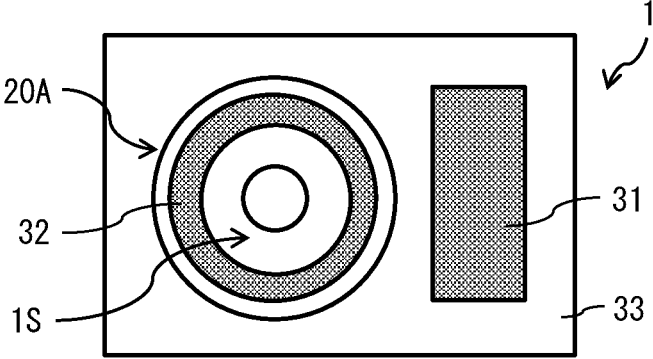
[ FIG. 3 ]
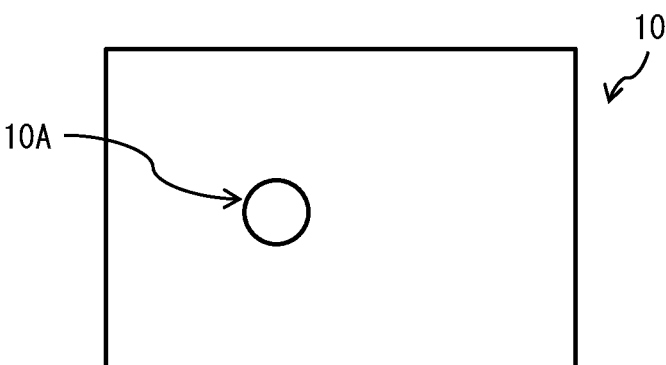

[ FIG. 4 ]
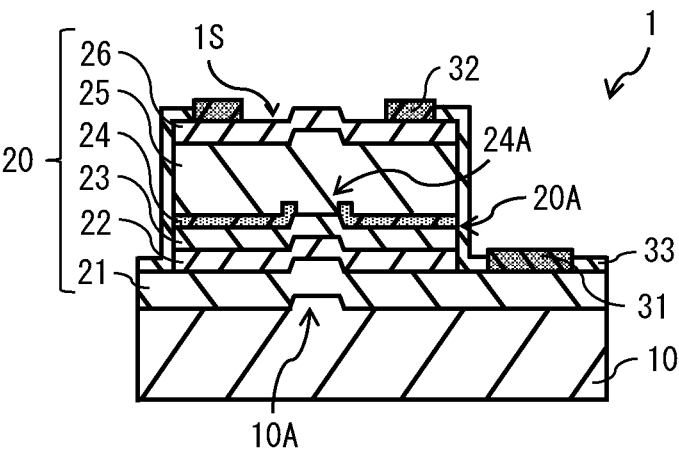
[ FIG. 5 ]
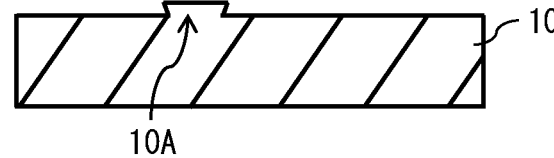

[ FIG. 6 ]
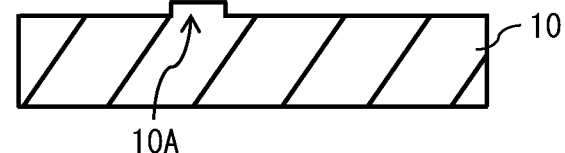
[ FIG. 7 ]
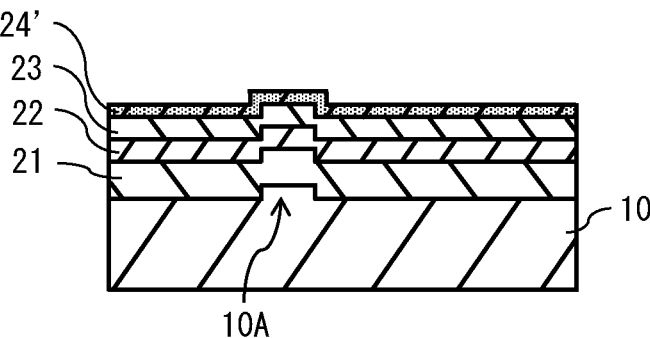
[ FIG. 8 ]
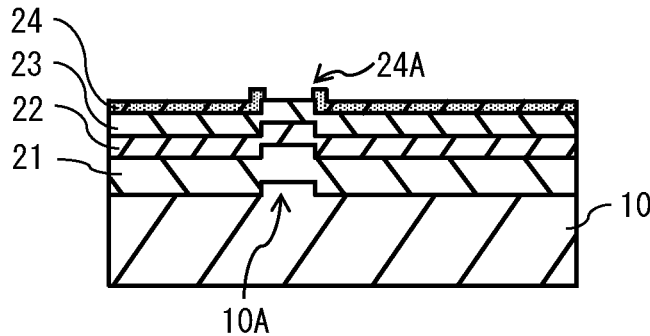

[ FIG. 9 ]
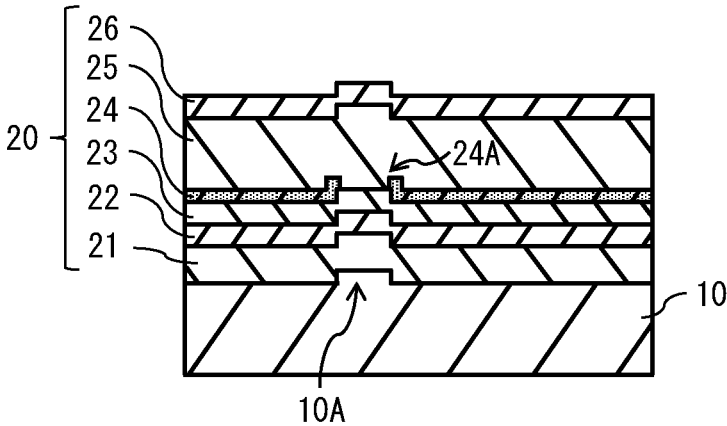
[ FIG. 10 ]
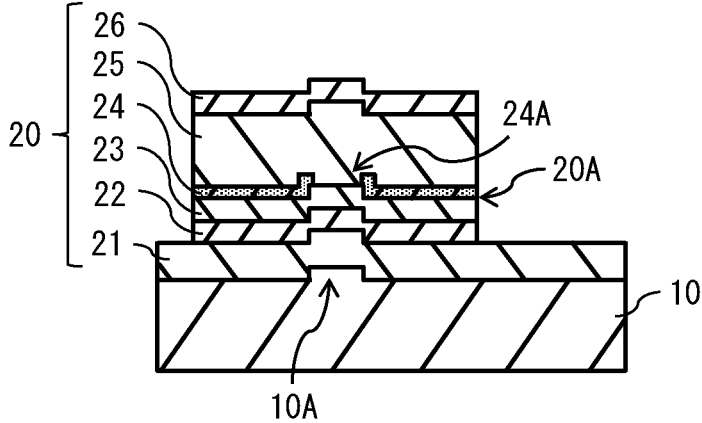

[ FIG. 11 ]
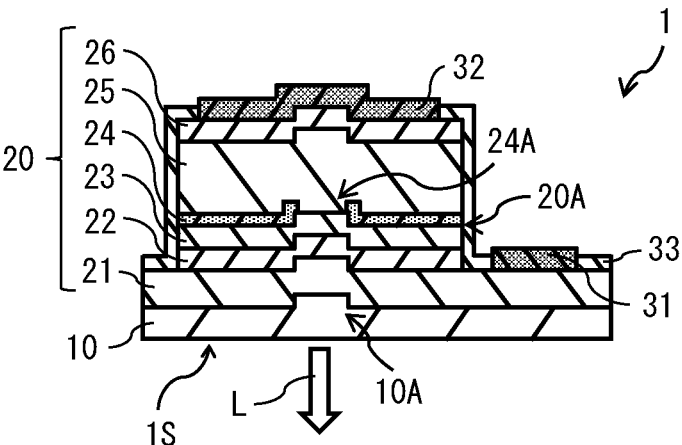

[ FIG. 12 ]
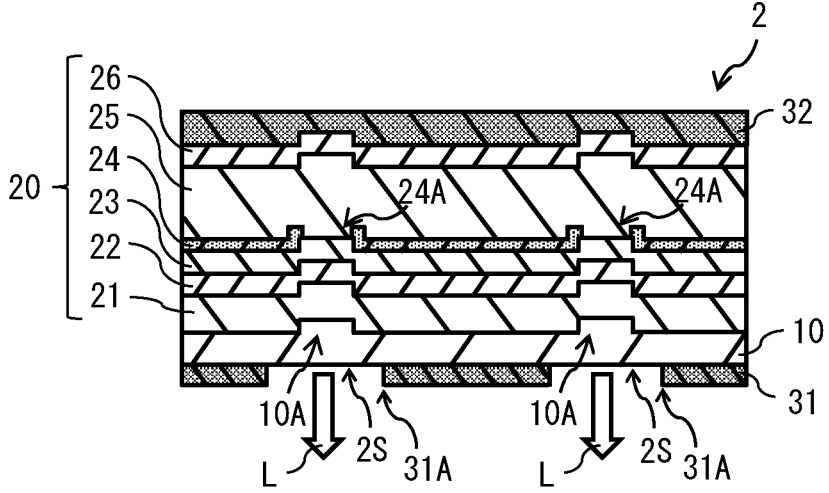
[ FIG. 13 ]
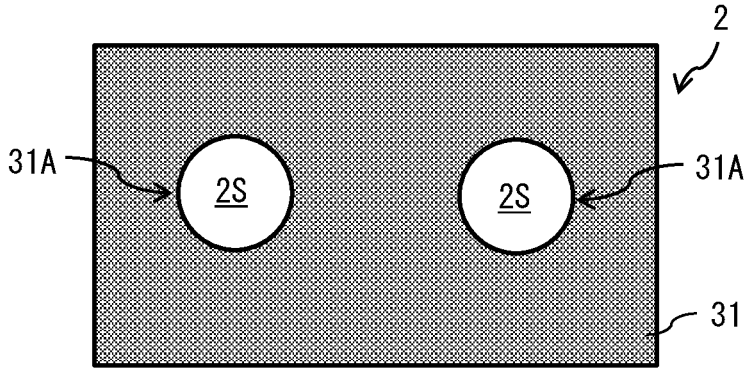

[ FIG. 14 ]
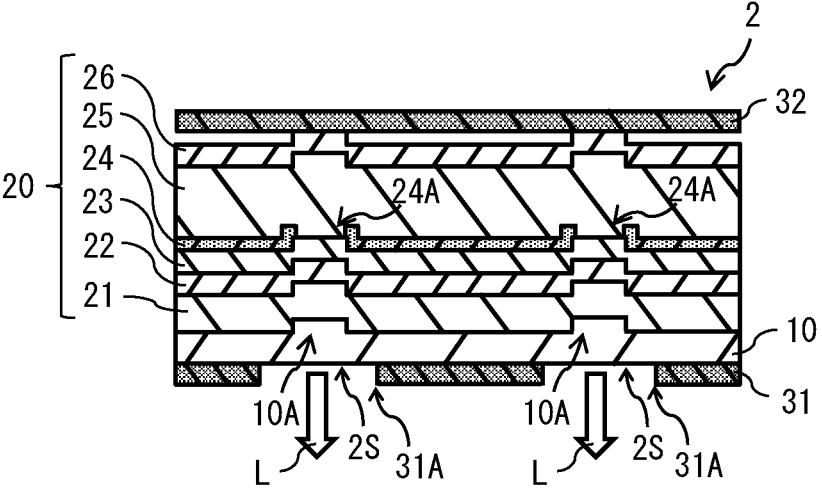
[ FIG. 15 ]
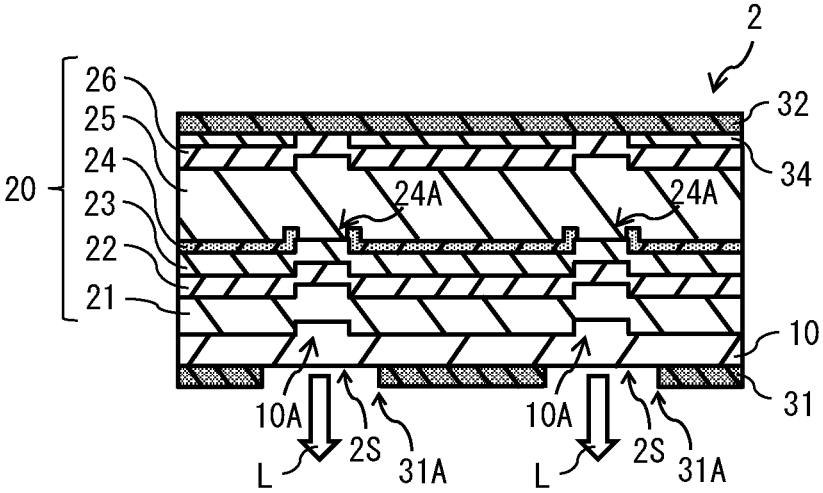

[ FIG. 16 ]
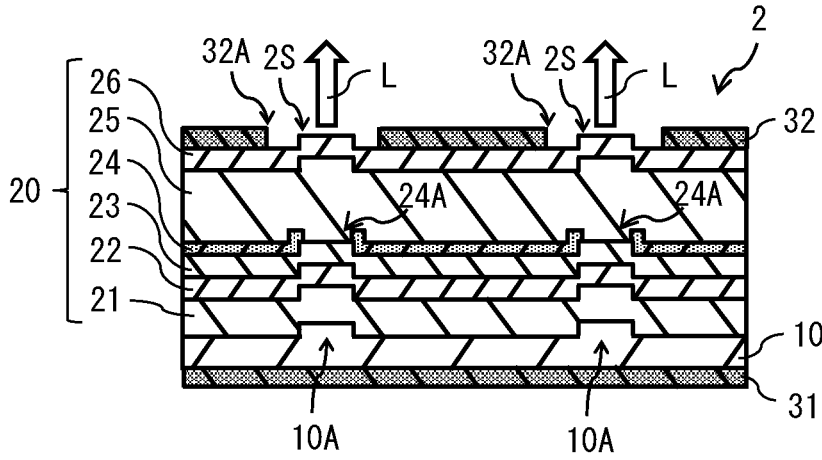
[ FIG. 17 ]
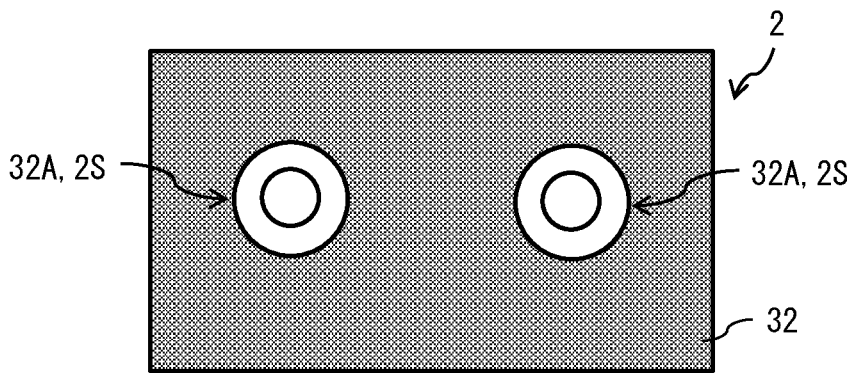

[ FIG. 18 ]
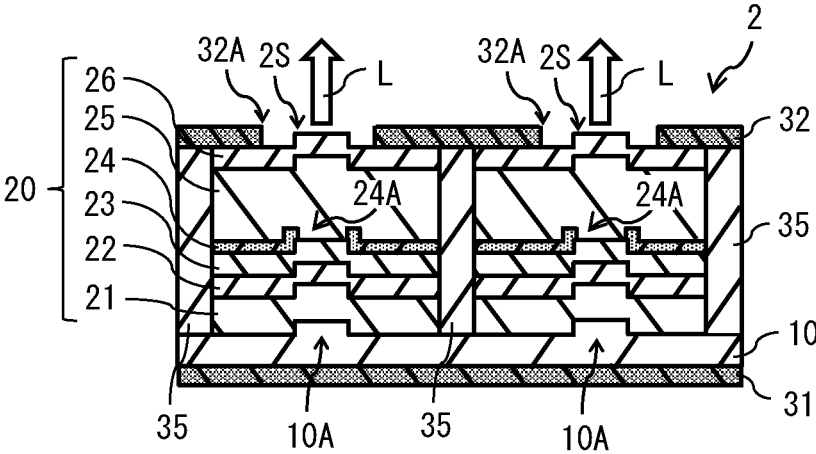
[ FIG. 19 ]
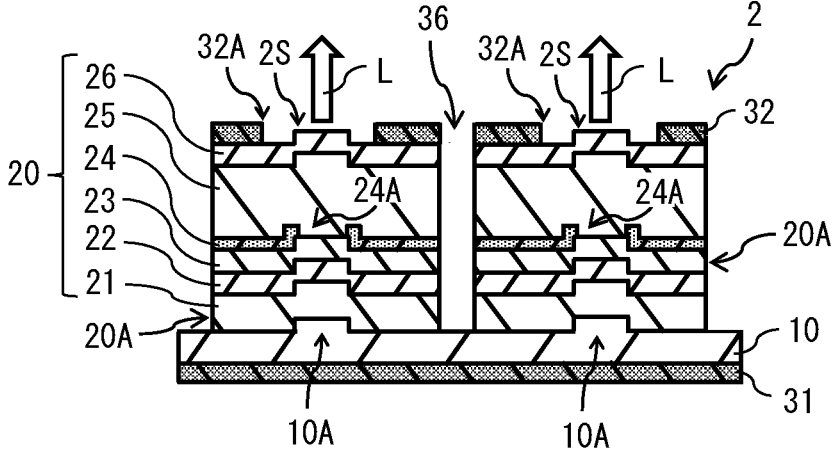

[ FIG. 20 ]
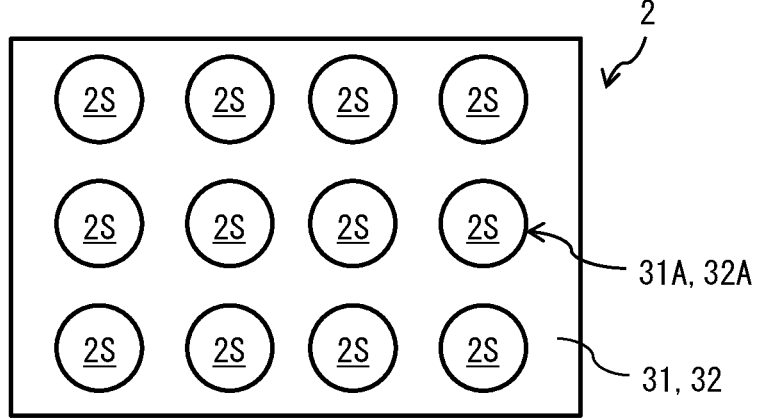
[ FIG. 21 ]
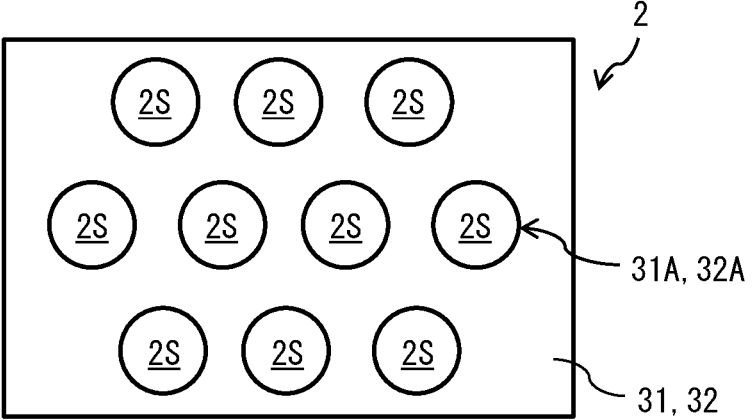

[ FIG. 22 ]
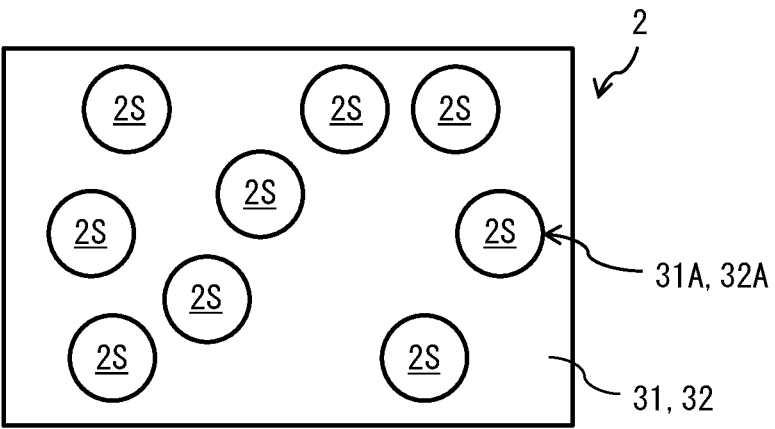

SURFACE EMITTING LASER AND SURFACE EMITTING LASER ARRAY

CROSS REFERENCE TO RELATED APPLICATIONS

This application is a U.S. National Phase of International Patent Application No. PCT/JP2021/038688 filed on Oct. 20, 2021, which claims priority benefit of Japanese Patent Application No. JP 2020-179990 filed in the Japan Patent Office on Oct. 27, 2020. Each of the above-referenced applications is hereby incorporated herein by reference in its entirety.

TECHNICAL FIELD

The present disclosure relates to a surface emitting laser and a surface emitting laser array.

BACKGROUND ART

A surface emitting laser is disclosed in, for example, Patent Literatures 1 and 2.

CITATION LIST

Patent Literature

Patent Literature 1: Japanese Unexamined Patent Application Publication No. 2001-210908
Patent Literature 2: Japanese Unexamined Patent Application Publication No. 2004-335964

SUMMARY OF THE INVENTION

Conventionally, in a surface emitting laser, a structure for current injection and light confinement is formed by oxidizing an AlAs layer or an AlGaAs layer, for example. However, there is a problem that an oxidation control is not easy, variation in the above-described structure is likely to occur, and variation in current characteristics and beam characteristics occurs. Therefore, it is desirable to provide a surface emitting laser and a surface emitting laser array that make it possible to suppress variation in current characteristics and beam characteristics.

A surface emitting laser according to one embodiment of the present disclosure includes: a substrate having a convex part provided on a surface thereof; and a vertical resonator structure formed on the substrate, and including an active layer, a first semiconductor layer, and a current blocking layer. The first semiconductor layer is a semiconductor layer of a first conductivity type having a step structure part having a shape conforming to the convex part at a location facing the convex part. The current blocking layer is a semiconductor layer of a second conductivity type different from the first conductivity type and having an opening in which an inner peripheral surface is in contact with an outer peripheral surface of the step structure part.

In the surface emitting laser according to one embodiment of the present disclosure, the convex part is provided on the surface of the substrate. In the vertical resonator structure provided on the substrate, the first semiconductor layer is provided with the step structure part of the shape conforming to the convex part at the location facing the convex part, and the opening part in which the inner peripheral surface is in contact with the outer peripheral surface of the step structure part is formed at the current blocking layer.

Accordingly, it is possible to narrow a current injected into the active layer by the opening (the step structure part) of the current blocking layer. In addition, because the step structure part is of the first conductivity type and the current blocking layer is of the second conductivity type different from the first conductivity type, it is possible to perform optical confinement in a lamination in-plane direction owing to a difference in refractive index due to the difference in conductivity type.

A surface emitting laser array according to one embodiment of the present disclosure includes: a substrate having a plurality of convex parts provided on a surface thereof; and a vertical resonator structure formed on the substrate, and including an active layer, a first semiconductor layer, and a current blocking layer. The first semiconductor layer is a semiconductor layer of a first conductivity type having a step structure part having a shape conforming to the convex part one by one at each location facing each of the convex parts. The current blocking layer is a semiconductor layer of a second conductivity type different from the first conductivity type and having an opening formed one by one for each of the step structure parts and in which an inner peripheral surface is in contact with an outer peripheral surface of the step structure part.

In the surface emitting laser array according to one embodiment of the present disclosure, the plurality of convex parts is provided on the surface of the substrate. In the vertical resonator structure provided on the substrate, the first semiconductor layer is provided with the step structure part of the shape conforming to the convex part one by one for each location facing each convex part, and the opening part in which the inner peripheral surface is in contact with the outer peripheral surface of the step structure part is formed one by one for each step structure part at the current blocking layer. Accordingly, it is possible to narrow a current injected into the active layer by the opening (the step structure part) of the current blocking layer. In addition, because the step structure part is of the first conductivity type and the current blocking layer is of the second conductivity type different from the first conductivity type, it is possible to perform optical confinement in a lamination in-plane direction owing to a difference in refractive index due to the difference in conductivity type.

BRIEF DESCRIPTION OF THE DRAWINGS

FIG. 1 is a diagram illustrating an example of a cross-sectional configuration of a surface emitting laser according to a first embodiment of the present disclosure.

FIG. 2 is a diagram illustrating an example of a top surface configuration of the surface emitting laser of FIG. 1.

FIG. 3 is a diagram illustrating an example of a top surface configuration of a substrate of FIG. 1.

FIG. 4 is a diagram illustrating one modification example of a cross-sectional configuration of the surface emitting laser of FIG. 1.

FIG. 5 is a diagram illustrating one modification example of a cross-sectional configuration of the substrate of FIG. 1.

FIG. 6 is a diagram illustrating an example of a method of manufacturing the surface emitting laser of FIG. 1.

FIG. 7 is a diagram illustrating an example of a process following FIG. 6.

FIG. 8 is a diagram illustrating an example of a process following FIG. 7.

FIG. 9 is a diagram illustrating an example of a process following FIG. 8.

FIG. 10 is a diagram illustrating an example of a process following FIG. 9.

FIG. 11 is a diagram illustrating one modification example of a cross-sectional configuration of the substrate of FIG. 1.

FIG. 12 is a diagram illustrating an example of a cross-sectional configuration of a surface emitting laser array according to a second embodiment of the present disclosure.

FIG. 13 is a diagram illustrating a configuration example of a back surface of the surface emitting laser of FIG. 12.

FIG. 14 is a diagram illustrating one modification example of a cross-sectional configuration of the surface emitting laser of FIG. 12.

FIG. 15 is a diagram illustrating one modification example of a cross-sectional configuration of the surface emitting laser of FIG. 12.

FIG. 16 is a diagram illustrating one modification example of a cross-sectional configuration of the surface emitting laser of FIG. 12.

FIG. 17 is a diagram illustrating an example of a top surface configuration of the surface emitting laser of FIG. 16.

FIG. 18 is a diagram illustrating one modification example of a cross-sectional configuration of the surface emitting laser of FIG. 16.

FIG. 19 is a diagram illustrating one modification example of a cross-sectional configuration of the surface emitting laser of FIG. 16.

FIG. 20 is a diagram illustrating one modification example of a back surface configuration of the surface emitting laser of FIG. 12, FIG. 14, or FIG. 15, or a diagram illustrating one modification example of a top surface configuration of the surface emitting laser of FIG. 16 or FIG. 18.

FIG. 21 is a diagram illustrating one modification example of a back surface configuration of the surface emitting laser of FIG. 12, FIG. 14, or FIG. 15, or a diagram illustrating one modification example of a top surface configuration of the surface emitting laser of FIG. 16 or FIG. 18.

FIG. 22 is a diagram illustrating one modification example of a back surface configuration of the surface emitting laser of FIG. 12, FIG. 14, or FIG. 15, or a diagram illustrating one modification example of a top surface configuration of the surface emitting laser of FIG. 16 or FIG. 18.

MODES FOR CARRYING OUT THE INVENTION

Hereinafter, embodiments for implementing the present disclosure will be described in detail with reference to the drawings. The following description is a specific example of the present disclosure, and the present disclosure is not limited to the following aspects. In addition, the present disclosure is not limited to the arrangement, dimensions, dimensional ratios, and the like of each component illustrated in each drawing. The description is given in the following order.

1. First Embodiment (surface emitting laser): FIG. 1 to FIG. 10
2. Modification Examples of First Embodiment (surface emitting laser): FIG. 11
3. Second Embodiment (surface emitting laser array): FIG. 12 and FIG. 13
4. Modification Examples of Second Embodiment (surface emitting laser array): FIG. 14 to FIG. 22

1. First Embodiment

[Configuration]

A surface emitting laser 1 according to a first embodiment of the present disclosure will be described. FIG. 1 illustrates a cross-sectional configuration example of the surface emitting laser 1. FIG. 2 illustrates an example of a top surface configuration of the surface emitting laser 1.

The surface emitting laser 1 includes a vertical resonator structure 20 on a substrate 10. As illustrated in FIGS. 1 and 3, for example, the substrate 10 is provided with a convex part 10A on a surface thereof. In the substrate 10, an outer peripheral surface of the convex part 10A constitutes a step part, and an upper surface and the skirt of the convex part 10A are flat surfaces. The height of the convex part 10A (the height of the outer peripheral surface of the convex part is, for example, 1 $\mu$m or less. The width of the convex part 10A is a size corresponding to the diameter of the opening 24A for narrowing a current injected into an active layer 22, and is, for example, 0.1 $\mu$m or more and 200 $\mu$m or less. The convex part 10A has, for example, a circular shape in plan view. The convex part 10A may have an elliptical shape, a rectangular shape, or a polygonal shape in plan view. The vertical cross-sectional shape of the convex part is, for example, a rectangular shape as illustrated in FIG. 1. The vertical cross-sectional shape of the convex part 10A may be, for example, a trapezoidal shape as illustrated in FIG. 4, or may be, for example, an inverted tapered shape as illustrated in FIG. 5.

The vertical resonator structure 20 is configured to oscillate at an oscillation wavelength $\lambda_0$ by two distributed Bragg reflector (DBR) layers 21 and 25 that face each other in the normal direction of the substrate 10. The DBR layer 21 is formed at a position closer to the substrate 10 than the DBR layer 25. The DBR layer 25 is formed at a position farther from the substrate 10 than the DBR layer 21. The surface emitting laser 1 is configured such that laser light L is outputted from the DBR layer 25 side. Therefore, the surface emitting laser 1 is a top emitting laser having a light output surface 1S of the laser light L on the top surface.

The vertical resonator structure 20 has a semiconductor stacked structure formed on the substrate 10 by epitaxial crystal growth using the substrate 10 as a crystal growth substrate. The vertical resonator structure 20 is formed on a region including the convex part 10A on the surface of the substrate 10. The vertical resonator structure 20 includes, for example, the DBR layer 21, the active layer 22, a spacer layer 23, a current blocking layer 24, the DBR layer 25, and a contact layer 26 in this order from the substrate 10 side.

In the vertical resonator structure 20, at least the active layer 22, the spacer layer 23, the current blocking layer 24, the DBR layer 25, and the contact layer 26 constitute a columnar mesa part 20A extending in the normal direction of the substrate 10. The DBR layer 21 is provided in a region on the substrate 10 side in a positional relationship with the mesa part 20A. The current blocking layer 24 is formed at a position opposite to the substrate 10 (that is, on the light output surface 1S side) in the positional relationship with the active layer 22. The convex part 10A is disposed at a position facing the mesa part 20A with the DBR layer 21 interposed therebetween.

The surface emitting laser 1 includes an electrode layer 32 in contact with the top portion (that is, the contact layer 26) of the mesa part 20A, and includes an electrode layer 31 in contact with the DBR layer 21 extending at the skirt of the mesa part 20A. The contact layer 26 is a layer for causing the DBR layer 25 and the electrode layer 32 to be in ohmic contact with each other. The DBR layer 21 is a layer serving as a current path between the electrode layer 31 and a center part of the mesa part 20A. The electrode layer 32 has, for example, a ring shape having an opening at least at a position facing a light emitting region of the active layer 22. A surface of the contact layer 26 exposed in the opening of the electrode layer 32 serves as the light output surface 1S. The electrode layer 31 is in contact with a part of the surface of the DBR layer 21 on the active layer 22 side corresponding to the skirt of the mesa part 20A (that is, an exposed surface exposed without being covered by the mesa part 20A).

The surface emitting laser 1 is formed by, for example, an arsenide semiconductor. The arsenide semiconductor refers to a compound semiconductor including an arsenic (As) element and including at least one element or more of aluminum (Al), gallium (Ga), and indium (In). The substrate 10 is, for example, an n-type semiconductor substrate. An example of the n-type semiconductor substrate that may be used for the substrate 10 is an n-type GaAs substrate. The substrate 10 may be a semi-insulating semiconductor substrate. Examples of the semi-insulating semiconductor substrate that may be used for the substrate 10 include a GaAs substrate. The substrate 10 may be a semi-insulating semiconductor substrate from the viewpoint of reducing the absorption of light emitted from the active layer 22. Examples of the semi-insulating semiconductor substrate that may be used for the substrate 10 include a semi-insulating GaAs substrate.

The DBR layer 21 is formed by alternately laminating a low refractive index layer (not illustrated) and a high refractive index layer (not illustrated). In the DBR layer 21, the low refractive index layer includes, for example, $Al_{x1}Ga_{1-x1}As$ ($0<x1<1$) having an optical thickness of $\lambda_0 \times \frac{1}{4}$ ($\lambda_0$ is an oscillation wavelength), and the high refractive index layer includes, for example, $Al_{x2}Ga_{1-x2}As$ ($0 \leq x2<x1$) having an optical thickness of $\lambda_0 \times \frac{1}{4}$. The conductivity type of the DBR layer 21 is, for example, n-type or i-type. The DBR layer 21 has a step structure part having a shape conforming to the convex part 10A at a position facing the convex part 10A. The step structure part of the DBR layer 21 has, for example, the same shape as the convex part 10A in plan view.

The active layer 22 has a multiple quantum well structure in which well layers (not illustrated) including undoped $In_{x3}Ga_{1-x3}As$ ($0<x3<1$) and barrier layers (not illustrated) including undoped $Al_{x4}Ga_{1-x4}As$ ($0 \leq x4<1$) are alternately stacked, for example. Note that a region of the active layer 22 facing an opening 24A described later is a light emitting region. The active layer 22 has a step structure part having a shape conforming to the convex part 10A at a location facing the convex part 10A. The step structure part of the active layer 22 has, for example, the same shape as the convex part 10A in plan view.

The spacer layer 23 includes, for example, p-type $Al_{x5}Ga_{1-x5}As$ ($0 \leq x5<1$). The spacer layer 23 has a step structure part having a shape conforming to the convex part 10A at a location facing the convex part 10A. The step structure part of the spacer layer 23 includes, for example, a p-type semiconductor (for example, p-type $Al_{x5}Ga_{1-x5}As$). The step structure part of the spacer layer 23 has, for example, the same shape as the convex part 10A in plan view.

The current blocking layer 24 narrows the current injected into the active layer 22 and performs optical confinement in the lamination in-plane direction. The current blocking layer 24 includes, for example, a semiconductor of a conductivity type different from the conductivity type of the step structure part of the spacer layer 23 (for example, n-type or i-type $Al_{x6}Ga_{1-x6}As$ ($0 \leq x6<1$)). The current blocking layer 24 has the opening 24A in which an inner peripheral surface is in contact with the outer peripheral surface of the step structure part of the spacer layer 23. Therefore, the step structure part of the spacer layer 23 is provided in the opening 24A. The opening 24A has, for example, the same shape as the convex part 10A in plan view. The opening 24A may have a shape different from that of the convex part 10A in plan view.

The DBR layer 25 is formed by alternately laminating a low refractive index layer (not illustrated) and a high refractive index layer (not illustrated). In the DBR layer 25, the low refractive index layer includes, for example, $Al_{x7}Ga_{1-x7}As$ ($0<x7<1$) having an optical thickness of $\lambda_0 \times \frac{1}{4}$, and the high refractive index layer includes, for example, $Al_{x8}Ga_{1-x8}As$ ($0 \leq x8<x7$) having an optical thickness of $\lambda_0 \times \frac{1}{4}$. The conductivity type of the DBR layer 25 is, for example, p-type or i-type. The DBR layer 25 has a step structure part having a shape conforming to the convex part 10A at a location facing the convex part 10A. The step structure part of the DBR layer 25 has, for example, the same shape as the convex part 10A in plan view. The DBR layer 25 is configured to have a smaller reflectance with respect to the oscillation wavelength $\lambda_0$ of the vertical resonator in the mesa part 20A than the DBR layer 21. The DBR layer 25 is formed to be thinner than the DBR layer 21, for example. The contact layer 26 includes, for example, p-type $Al_{x9}Ga_{1-x9}As$ ($0 \leq x9<1$). The contact layer 26 has a step structure part having a shape conforming to the convex part 10A at a location facing the convex part 10A. The step structure part of the contact layer 26 has, for example, the same shape as the convex part 10A in plan view.

The electrode layer 31 is in contact with a surface of the DBR layer 21 on the mesa part 20A side. The electrode layer 31 includes an alloy, and is, for example, a laminate formed by laminating AuGe, Ni, and Au in this order from the DBR layer 21 side. The electrode layer 32 includes a non-alloy, and is, for example, a laminate formed by laminating Ti, Pt, and Au in this order from the contact layer 26 side. An insulating layer 33 is formed around the mesa part 20A. The insulating layer 33 is a layer for protecting the mesa part 20A, and includes, for example, $SiO_2$ or $Si_3N_4$.

[Manufacturing Method]

Next, a method for manufacturing the surface emitting laser 1 according to the present embodiment will be described.

In order to manufacture the surface emitting laser 1, a compound semiconductor is formed on the substrate 10 that includes, for example, GaAs at once by an epitaxial crystal growth method such as, for example, an MOCVD (Metal Organic Chemical Vapor Deposition: a metal organic chemical vapor deposition) method. At this time, as a raw material of the compound semiconductor, for example, a methyl-based organometallic gas such as trimethylaluminum (TMAl), trimethylgallium (TMGa), or trimethylindium (TMIn) and an arsine ($AsH_3$) gas are used, as a raw material of the donor impurity, for example, disilane ($Si_2H_6$) is used, and as a raw material of the acceptor impurity, for example, carbon tetrabromide ($CBr_4$) is used.

First, the convex part 10A is formed on the surface of the substrate 10 (FIG. 6). For example, after a circular resist layer (not illustrated) is formed on the surface of the substrate 10, the substrate 10 is selectively etched using the resist layer as a mask to form the convex part 10A. Thereafter, the resist layer is removed. Next, the DBR layer 21, the active layer 22, the spacer layer 23, and the current blocking layer 24' are formed on the surface of the substrate 10 by epitaxial crystal growth such as the MOCVD method (FIG. 7). The current blocking layer 24' includes the same material as the current blocking layer 24. At this time, in each of the active layer 22, the spacer layer 23, and the current blocking layer 24', a step structure part having a shape conforming to the convex part 10A is formed in a region facing the convex part 10A.

Next, a resist layer (not illustrated) having a circular opening, for example, is formed on the surface of the current blocking layer 24' and in a region facing the convex part 10A, and then the current blocking layer 24' is selectively etched using the resist layer as a mask. Thus, the current blocking layer 24 having the opening 24A is formed in a region facing the convex part (FIG. 8). Thereafter, the resist layer is removed. Next, the DBR layer 25 and the contact layer 26 are formed on the surface of the current blocking layer 24 by epitaxial crystal growth such as the MOCVD method (FIG. 9). At this time, in each of the DBR layer 25 and the contact layer 26, a step structure part having a shape conforming to the convex part 10A is formed in a region facing the convex part 10A. In this way, the vertical resonator structure 20 is formed on the substrate 10.

Next, for example, a circular resist layer (not illustrated) is formed on the surface of the vertical resonator structure 20 (contact layer 26) and covering a predetermined region centered on the step structure part of the contact layer 26, and then the vertical resonator structure 20 is selectively etched using this resist layer as a mask and the vertical resonator structure 20 is etched to a depth reaching the DBR layer 21. At this time, for example, reactive ion etching (RIE) using a Cl-based gas is preferably used. In this manner, the columnar mesa part 20A is formed. At this time, the DBR layer 21 is exposed in the skirt of the mesa part 20A. Thereafter, the resist layer is removed.

Next, the electrode layer 32 in contact with the upper surface of the mesa part 20A (for example, the contact layer 26) is formed, and then the insulating layer 33 covering the mesa part is formed. At this time, an opening is formed at a predetermined location in the skirt of the mesa part 20A. Next, in the opening, the electrode layer 31 in contact with the surface (exposed surface) of the DBR layer 21 on the mesa part 20A side is formed. In this manner, the surface emitting laser 1 is manufactured.

[Operation]

In the surface emitting laser 1 having such a configuration, when a predetermined voltage is applied between the electrode layer 31 electrically coupled to the DBR layer 21 and the electrode layer 32 electrically coupled to the contact layer 26, a current narrowed by the current blocking layer 24 is injected into the active layer 22, and thus light emission is generated by recombination of electrons and holes. At this time, light generated in the active layer 22 is confined in the lamination in-plane direction by the current blocking layer 24. As a result, laser oscillation occurs at the oscillation wavelength $\lambda_0$ by the vertical resonator in the mesa part 20A. Then, the light leaking from the DBR layer 25 becomes the beam-shaped laser light L and is outputted to the outside from the light output surface 1S.

[Effect]

Next, an effect of the surface emitting laser 1 according to the present embodiment will be described.

Conventionally, in a surface emitting laser, a structure (oxidation constriction layer) for current injection and light confinement is formed by oxidizing, for example, an AlAs layer or an AlGaAs layer. However, there is a problem that an oxidation control is not easy, variation in the above-described structure is likely to occur, and variation in current characteristics and beam characteristics occurs.

In contrast, in the present embodiment, the current blocking layer 24 is provided instead of the oxide constriction layer. In the current blocking layer 24, the current confinement is performed by the opening 24A formed by etching. Therefore, the shape and size of the opening 24A are less likely to vary, and the current characteristics are less likely to vary.

In addition, in the present embodiment, the convex part 10A is provided on the surface of the substrate 10. In the vertical resonator structure 20 provided on the substrate 10, the spacer layer 23 is provided with the step structure part having the shape conforming to the convex part at the location facing the convex part 10A, and the current blocking layer 24 is formed with the opening 24A in which the inner peripheral surface is in contact with the outer peripheral surface of the step structure part of the spacer layer 23. Accordingly, it is possible to narrow the current injected into the active layer 22 by the opening 24A (the step structure part) of the current blocking layer 24. In addition, because the step structure part of the spacer layer 23 is of the first conductivity type and the current blocking layer 24 is of the conductivity type different from the conductivity type of the step structure part of the spacer layer 23, it is possible to perform the optical confinement in the in-plane direction of the stacked layer owing to a difference in refractive index caused by a difference in conductivity type. Therefore, it is possible to suppress variations in current characteristics and beam characteristics.

2. Modification Examples According to First Embodiment

Modification Example A

In the above embodiment, for example, as illustrated in FIG. 11, the electrode layer 32 may cover the upper surface of the mesa part 20A, the thickness of the substrate 10 may be reduced, and the DBR layer 21 may be formed to be thinner than the DBR layer 25, for example. In this case, the surface emitting laser 1 outputs the laser light L from the DBR layer 21 side. Therefore, the surface emitting laser 1 according to the present modification example is a backside emission laser having the light output surface 1S of the laser light L on the back surface.

In the present modification example, as in the above-described embodiment, the convex part 10A is provided on the surface of the substrate 10. In the vertical resonator structure provided on the substrate 10, the spacer layer 23 is provided with the step structure part having the shape conforming to the convex part 10A at the location facing the convex part 10A, and the current blocking layer 24 is formed with the opening 24A in which the inner peripheral surface is in contact with the outer peripheral surface of the step structure part of the spacer layer 23. Accordingly, it is possible to narrow the current injected into the active layer 22 by the opening 24A (the step structure part) of the current blocking layer 24. In addition, because the step structure part of the spacer layer 23 is of the first conductivity type and the current blocking layer 24 is of the conductivity type different from the conductivity type of the step structure part of the spacer layer 23, it is possible to perform the optical confinement in the in-plane direction of the stacked layer owing to a difference in refractive index caused by a difference in conductivity type. Therefore, also in the present modification example, it is possible to suppress variations in current characteristics and beam characteristics.

3. Second Embodiment

[Configuration]

A surface emitting laser array 2 according to a second embodiment of the present disclosure will be described. FIG. 12 illustrates a cross-sectional configuration example of the surface emitting laser array 2. FIG. 13 illustrates a configuration example of a back surface of the surface emitting laser array 2.

In the present embodiment, a plurality of convex parts 10A is provided on the surface of the substrate 10. In the DBR layer 21, the active layer 22, the spacer layer 23, the DBR layer and the contact layer 26, the step structure part having a shape conforming to the convex part is formed one by one for each location facing each convex part 10A. Furthermore, in the present embodiment, in the current blocking layer 24, the opening 24A in which the inner peripheral surface is in contact with the outer peripheral surface of the step structure part of the spacer layer 23 is formed one by one for each step structure part of the spacer layer 23.

Accordingly, it is possible to narrow the current injected into the active layer 22 by the opening 24A (the step structure part) of the current blocking layer 24. In addition, because the step structure part of the spacer layer 23 is of the first conductivity type and the current blocking layer 24 is of the conductivity type different from the conductivity type of the step structure part of the spacer layer 23, it is possible to perform the optical confinement in the in-plane direction of the stacked layer owing to a difference in refractive index caused by a difference in conductivity type. Therefore, also in the present embodiment, it is possible to suppress variations in current characteristics and beam characteristics.

In addition, in the present embodiment, each opening 24A of the current blocking layer 24 is formed at the position facing each convex part 10A of the substrate 10. Here, because each convex part 10A of the substrate 10 is formed by selective etching with respect to the substrate 10, it is possible to easily narrow a pitch of the plurality of convex parts 10A. In a case where the pitch of the plurality of convex parts 10A is narrowed, it is also possible to narrow the pitch of the plurality of openings 24A in the current blocking layer 24. Therefore, in the present embodiment, it is possible to easily narrow an output pitch of the plurality of pieces of laser light L.

Incidentally, in the present embodiment, for example, as illustrated in FIG. 13, the electrode layer 31 is in contact with the substrate 10, and the electrode layer 31 is provided with the opening 31A one by one for each location facing each convex part 10A. A region of the back surface of the substrate 10 exposed to a bottom surface of each opening 31A is a light output surface 2S from which the laser light L is outputted. Further, the electrode layer 32 is a solid film in contact with the entire surface of the contact layer 26. Thus, by applying a predetermined voltage to the electrode layers 31 and 32, it is possible to simultaneously drive each emitter included in the vertical resonator structure 20.

4. Modification Examples According to Second Embodiment

Modification Example B

In the second embodiment, for example, as illustrated in FIG. 14, the electrode layer 32 is in contact with each step structure part of the contact layer 26, is not in contact with the skirt of each step structure part in the contact layer 26 at all, and is disposed to face the contact layer 26 via a gap. Thus, by applying a predetermined voltage to the electrode layers 31 and 32, it is possible to simultaneously drive each emitter included in the vertical resonator structure 20. In addition, because the path of the current injected into the active layer 22 is limited to each step structure part of the contact layer 26, it is possible to improve a current injection efficiency into the active layer 22 as compared with a case where the electrode layer 32 is a solid film in contact with the entire surface of the contact layer 26.

Modification Example C

In the second Embodiment, for example, as illustrated in FIG. 15, the electrode layer 32 is in contact with each step structure part of the contact layer 26, and is disposed to face the skirt of each step structure part in the contact layer 26 via a resin layer 34. Thus, by applying a predetermined voltage to the electrode layers 31 and 32, it is possible to simultaneously drive each emitter included in the vertical resonator structure 20. In addition, because the path of the current injected into the active layer 22 is limited to each step structure part of the contact layer 26, it is possible to improve the current injection efficiency into the active layer 22 as compared with a case where the electrode layer 32 is a solid film in contact with the entire surface of the contact layer 26.

Modification Example D

In the second embodiment, for example, as illustrated in FIG. 16, the electrode layer 31 is a solid film in contact with the entire back surface of the substrate 10, and for example, as illustrated in FIG. 17, the electrode layer 32 is provided with the opening 32A one by one for each location facing each convex part 10A. A region of the contact layer 26 exposed on the bottom surface of each opening 32A is the light output surface 2S from which the laser light L is outputted. Thus, by applying a predetermined voltage to the electrode layers 31 and 32, it is possible to simultaneously drive each emitter included in the vertical resonator structure 20.

Modification Example E

In the second embodiment, the surface emitting laser array 2 may further include a separation part 35 that electrically separates the vertical resonator structure 20 for each step structure part of the spacer layer 23, as illustrated in FIG. 18, for example. The separation part 35 is formed, for example, in the vertical resonator structure 20 to a depth reaching the substrate 10 from the surface of the contact layer 26. The separation part 35 is configured by, for example, a region having high resistance by performing ion implantation on the vertical resonator structure 20. When the high resistance region is formed by ion implantation, for example, boron (B), nitrogen (N), proton (H), or the like is used. In this manner, by providing the separation part 35 for the vertical resonator structure 20, it is possible to suppress leakage of light and electricity to other adjacent emitters.

Modification Example F

In the second embodiment, the surface emitting laser array 2 may further include, for example, as illustrated in FIG. 19, a gap 36 that electrically separates the vertical resonator structure 20 for each step structure part of the spacer layer 23. The gap 36 is formed by forming the vertical resonator structure 20 into a mesa shape for each step structure part of the spacer layer 23. In this manner, by providing the gap 36 with respect to the vertical resonator structure 20, the electrode layer 32 is provided for each emitter, and thus it is possible to simultaneously drive each emitter included in the vertical resonator structure 20.

Modification Example G

FIGS. 20, 21, and 22 each illustrate one modification example of a back surface configuration of the surface emitting laser array 2 of FIG. 12, 14, or 15, or one modification example of a top surface configuration of the surface emitting laser array 2 of FIG. 16 or 18. In the present modification example, a plurality of openings 31A and 32A formed in the electrode layers 31 and 32 is arranged side by side in a square closest-packed lattice or a hexagonal close-packed lattice, for example, as illustrated in FIGS. 20 and 21. In the present modification example, the plurality of openings 31A and 32A formed in the electrode layers 31 and 32 is arranged in a random manner as illustrated in FIG. 22, for example. In this manner, in the present modification example, because it is possible to form the positions of the plurality of openings 31A and 32A at any positions, flexible design according to the application is possible.

Although the present disclosure has been described above with reference to the embodiments and the modification examples thereof, the present disclosure is not limited to the above-described embodiments and the like, and various modifications can be made. Note that the effects described in the present specification are merely examples. The effects of the present disclosure are not limited to the effects described in the present specification. The present disclosure may have effects other than the effects described in the present specification.

For example, the present disclosure can have the following configurations.

(1)

A surface emitting laser including:

a substrate having a convex part provided on a surface thereof; and a vertical resonator structure formed on the substrate, and including an active layer, a first semiconductor layer, and a current blocking layer, in which the first semiconductor layer is a semiconductor layer of a first conductivity type having a step structure part having a shape conforming to the convex part at a location facing the convex part, and the current blocking layer is a semiconductor layer of a second conductivity type different from the first conductivity type and having an opening in which an inner peripheral surface is in contact with an outer peripheral surface of the step structure part.

(2)

The surface emitting laser according to (1), in which the vertical resonator structure further includes a first DBR (distributed Bragg reflector) layer provided on the substrate side in a positional relationship with the active layer, and a second DBR layer provided on an opposite side to the substrate in a positional relationship with the active layer, the first semiconductor layer is a spacer layer provided between the active layer and the second DBR layer, and the current blocking layer is provided between the first semiconductor layer and the second DBR layer.

(3)

The surface emitting laser according to (2), in which the first semiconductor layer is a p-type semiconductor layer, and the current blocking layer is an n-type or i-type single-layer semiconductor layer, or an n-type or i-type DBR layer.

(4)

A surface emitting laser array including:

a substrate having a plurality of convex parts provided on a surface thereof; and a vertical resonator structure formed on the substrate, and including an active layer, a first semiconductor layer, and a current blocking layer, in which the first semiconductor layer is a semiconductor layer of a first conductivity type having a step structure part having a shape conforming to the convex part one by one at each location facing each of the convex parts, and the current blocking layer is a semiconductor layer of a second conductivity type different from the first conductivity type and having an opening formed one by one for each of the step structure parts and in which an inner peripheral surface is in contact with an outer peripheral surface of the step structure part.

(5)

The surface emitting laser array according to (4), further including a separation part that electrically separates the vertical resonator structure for each of the step structure parts.

(6)

The surface emitting laser array according to (5), in which the separation part is configured by a region having a high resistance by performing ion implantation on the vertical resonator structure.

(7)

The surface emitting laser array according to (5), in which the vertical resonator structure has a mesa shape for each of the step structure parts, and the separation part is configured by a gap.

According to a surface emitting laser of one embodiment of the present disclosure, the convex part is provided on the surface of the substrate, the step structure part having a shape conforming to the convex part is provided in the first semiconductor layer at the location facing the convex part, and the opening in which the inner peripheral surface is in contact with the outer peripheral surface of the step structure part is formed in the current blocking layer. Thus, it is possible to narrow the current injected into the active layer by the opening (the step structure part) of the current blocking layer. Further, because the step structure part is of the first conductivity type and the current blocking layer is of the second conductivity type different from the first conductivity type, it is possible to perform optical confinement in the in-plane direction of the stacked layer owing to the difference in refractive index caused by the difference in conductivity type. Therefore, it is possible to suppress variations in current characteristics and beam characteristics.

According to a surface emitting laser array of one embodiment of the present disclosure, the plurality of convex parts is provided on the surface of the substrate, the first semiconductor layer is provided with the step structure part having a shape conforming to the convex part one by one for each location facing the convex part, and the opening having the inner peripheral surface in contact with the outer peripheral surface of the step structure part is formed one by one for each step structure part in the current blocking layer. Thus, it is possible to narrow the current injected into the active layer by each opening (the step structure part) of the current blocking layer. Further, because the step structure part is of the first conductivity type and the current blocking layer is of the second conductivity type different from the first conductivity type, it is possible to perform optical confinement in the in-plane direction of the stacked layer owing to the difference in refractive index caused by the difference in conductivity type. Therefore, it is possible to suppress variations in current characteristics and beam characteristics.

The present application claims the benefit of Japanese Priority Patent Application JP2020-179990 filed with the Japan Patent Office on Oct. 27, 2020, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A surface emitting laser, comprising:
a substrate comprising a convex part on a surface of the substrate; and
a vertical resonator structure on the substrate, wherein the vertical resonator structure includes an active layer, a first semiconductor layer, and a current blocking layer, wherein:
    the first semiconductor layer comprises a semiconductor layer of a first conductivity type,
    the first semiconductor layer includes a step structure part that has a shape which conforms to the convex part at a location that faces the convex part,
    the current blocking layer comprises a semiconductor layer of a second conductivity type different from the first conductivity type,
    the current blocking layer has an opening in which an inner peripheral surface is in contact with an outer peripheral surface of the step structure part, and
    the opening has a same shape as the convex part in plan view.

2. The surface emitting laser according to claim 1, wherein the vertical resonator structure further includes:
a first DBR (distributed Bragg reflector) layer on a substrate side in a positional relationship with the active layer, and
a second DBR layer on an opposite side to the substrate in a positional relationship with the active layer, and wherein the first semiconductor layer comprises a spacer layer between the active layer and the second DBR layer, and
    the current blocking layer is between the first semiconductor layer and the second DBR layer.

3. The surface emitting laser according to claim 2, wherein
    the first semiconductor layer comprises a p-type semiconductor layer, and
    the current blocking layer comprises an n-type or i-type single-layer semiconductor layer, or an n-type or i-type DBR layer.

4. A surface emitting laser array, comprising:
a substrate comprising a plurality of convex parts on a surface of the substrate; and
a vertical resonator structure on the substrate, wherein the vertical resonator structure includes an active layer, a first semiconductor layer, and a current blocking layer, wherein:
    the first semiconductor layer comprises a semiconductor layer of a first conductivity type,
    the first semiconductor layer includes a plurality of step structure parts, each step structure part of the plurality of step structure parts faces a corresponding convex part of the plurality of convex parts,
    each step structure part of the plurality of step structure parts has a shape conforming to the corresponding convex part of the plurality of convex parts, and
    the current blocking layer comprises a semiconductor layer of a second conductivity type different from the first conductivity type,
    the current blocking layer has an opening for each of the plurality of step structure parts, and
    the opening has an inner peripheral surface in contact with an outer peripheral surface of a corresponding step structure part of the plurality of step structure parts, and
    the opening has a same shape as the corresponding convex part in plan view.

5. The surface emitting laser array according to claim 4, further comprising a separation part that is configured to electrically separate the vertical resonator structure for each of the plurality of step structure parts.

6. The surface emitting laser array according to claim 5, wherein the separation part comprises a region having a high resistance, and the separation part is configured to perform ion implantation on the vertical resonator structure.

7. The surface emitting laser array according to claim 5, wherein
    the vertical resonator structure has a mesa shape for each of the plurality of step structure parts, and
    the separation part comprises a gap.

* * * * *